US007729181B2

(12) United States Patent
Morita et al.

(10) Patent No.: US 7,729,181 B2
(45) Date of Patent: Jun. 1, 2010

(54) SEMICONDUCTOR STORAGE DEVICE USING A BITLINE GND SENSING SCHEME FOR A REDUCED REAL ESTATE OF PRE-SENSE AMPLIFIER

(75) Inventors: Keizo Morita, Kawasaki (JP); Shoichiro Kawashima, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 2 days.

(21) Appl. No.: 11/653,909

(22) Filed: Jan. 17, 2007

(65) Prior Publication Data
US 2008/0055960 A1  Mar. 6, 2008

(30) Foreign Application Priority Data
Aug. 30, 2006 (JP) .............................. 2006-234537

(51) Int. Cl.
G11C 7/06 (2006.01)
(52) U.S. Cl. .............................. 365/189.15; 365/189.11; 365/196; 365/204; 365/145
(58) Field of Classification Search ............ 365/189.11, 365/145, 204, 202, 203, 189.15, 189.06, 365/196
See application file for complete search history.

(56) References Cited
U.S. PATENT DOCUMENTS
6,421,268 B2 * 7/2002 Kato et al. .................. 365/145

| | | | |
|---|---|---|---|
| 6,487,103 B2 | 11/2002 | Yamamoto et al. | |
| 6,661,697 B2 | 12/2003 | Yamamoto et al. | |
| 6,856,560 B2 * | 2/2005 | Rehm et al. ................. | 365/200 |
| 6,906,975 B2 * | 6/2005 | Kang et al. ................. | 365/211 |
| 2005/0195639 A1 | 9/2005 | Fukushi et al. | |

FOREIGN PATENT DOCUMENTS
JP  2002-133857 A  5/2002
JP  2005-293818 A  10/2005

OTHER PUBLICATIONS
Shoichiro Kawashima, "Bitline GND Sensing Technique for Low-Voltage Operation FeRAM", IEEE Journal of Solid-State Circuits, vol. 37, No. 5, May 2002, pp. 592-598.

* cited by examiner

Primary Examiner—Andrew Q Tran
(74) Attorney, Agent, or Firm—Fujitsu Patent Center

(57) ABSTRACT

A semiconductor storage device comprises of a memory cell connected to a plate line and a bit line, a potential shift circuit which is connected to a bit line, temporarily changes in output voltage corresponding to the voltage change of the bit line when a voltage is applied to the plate line, a charge transfer circuit for transferring charge stored on the potential shift circuit corresponding to the temporary output voltage change of the potential shift circuit, and a charge accumulation circuit for generating a read voltage from a memory cell after accumulating the transferred charge.

10 Claims, 9 Drawing Sheets

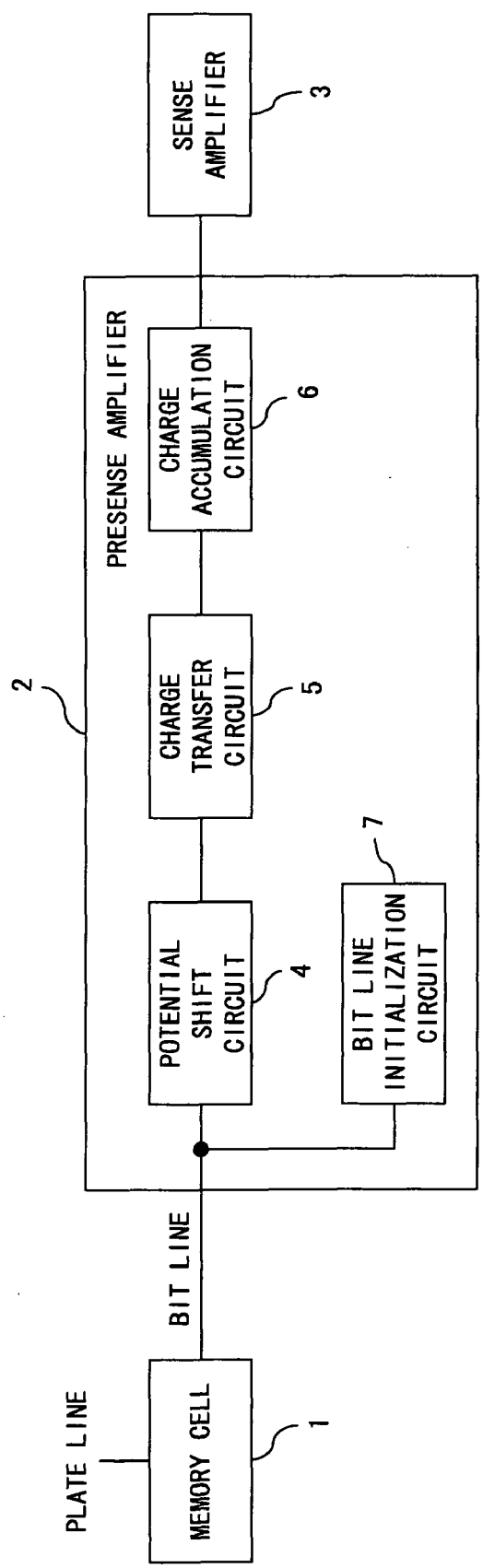
F I G. 3

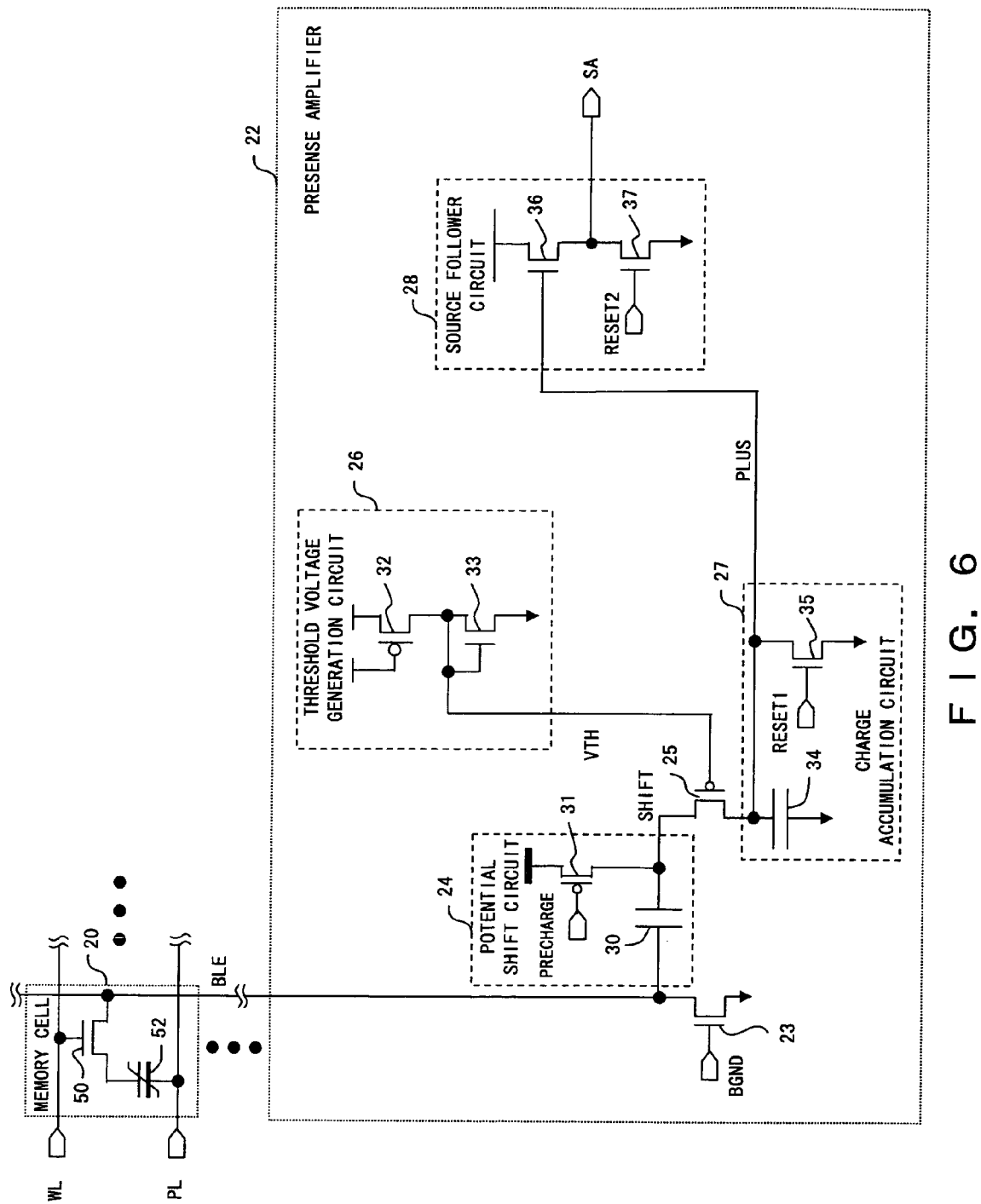
F I G. 6

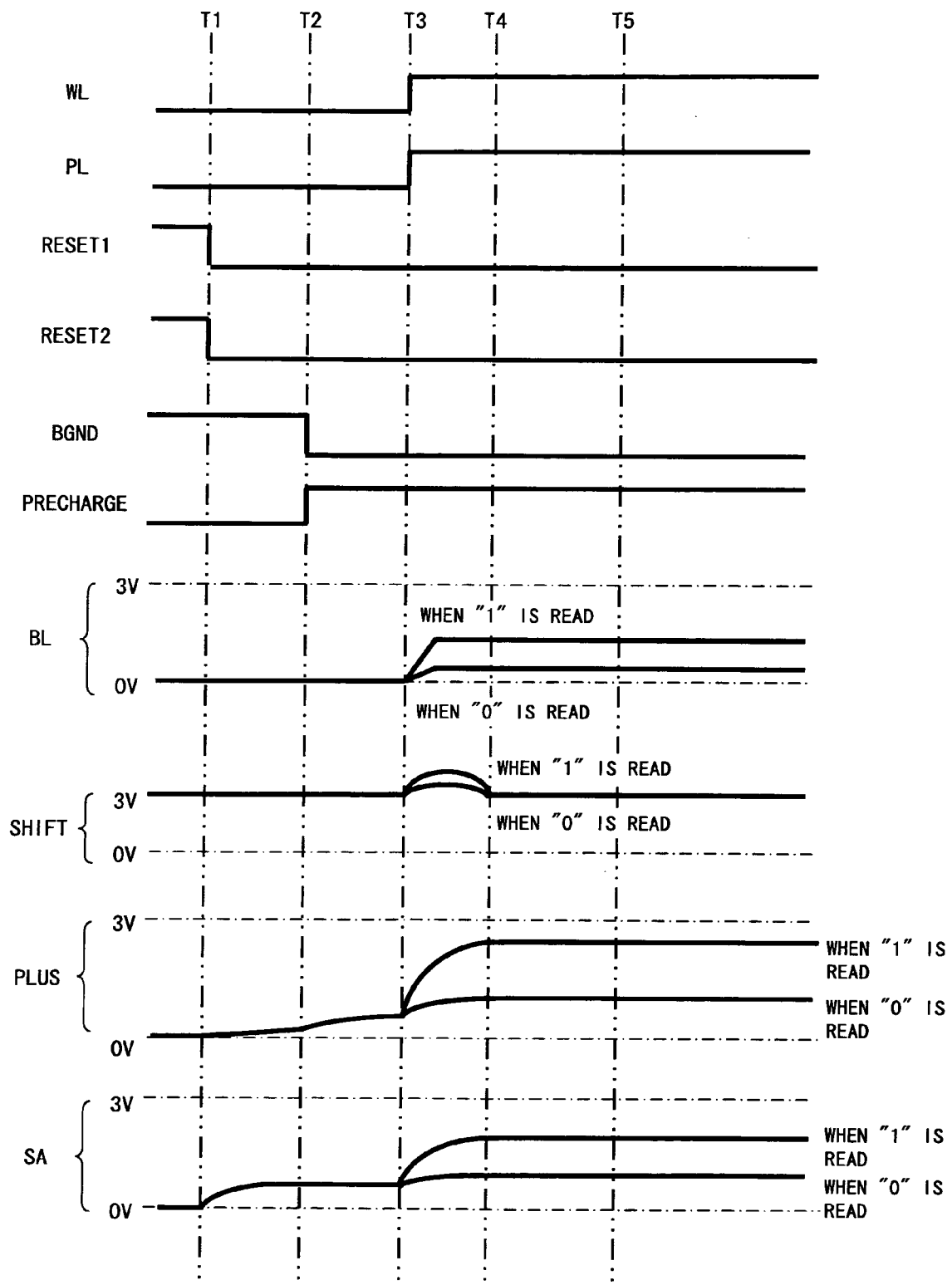
F I G. 7

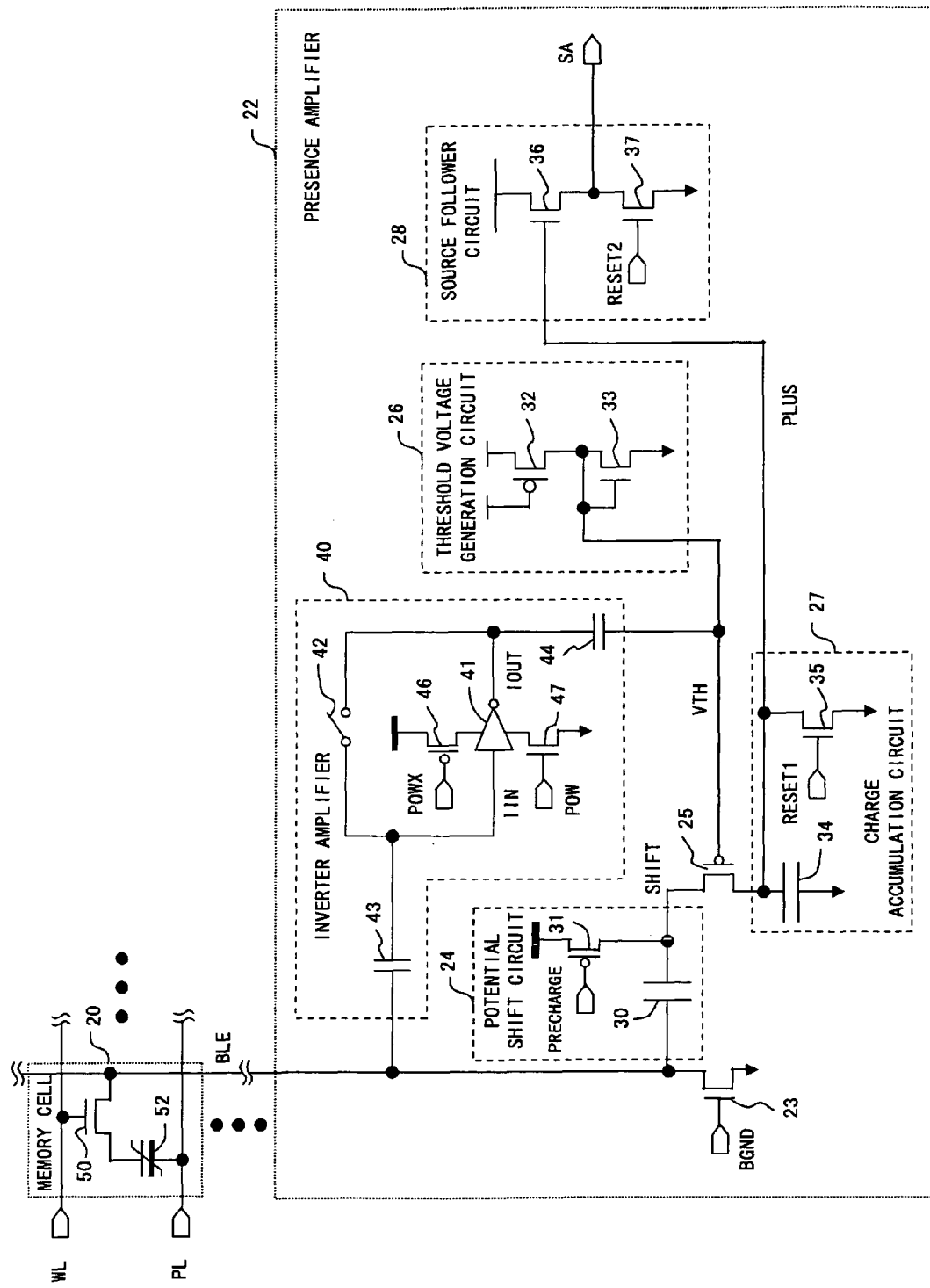
F I G. 8

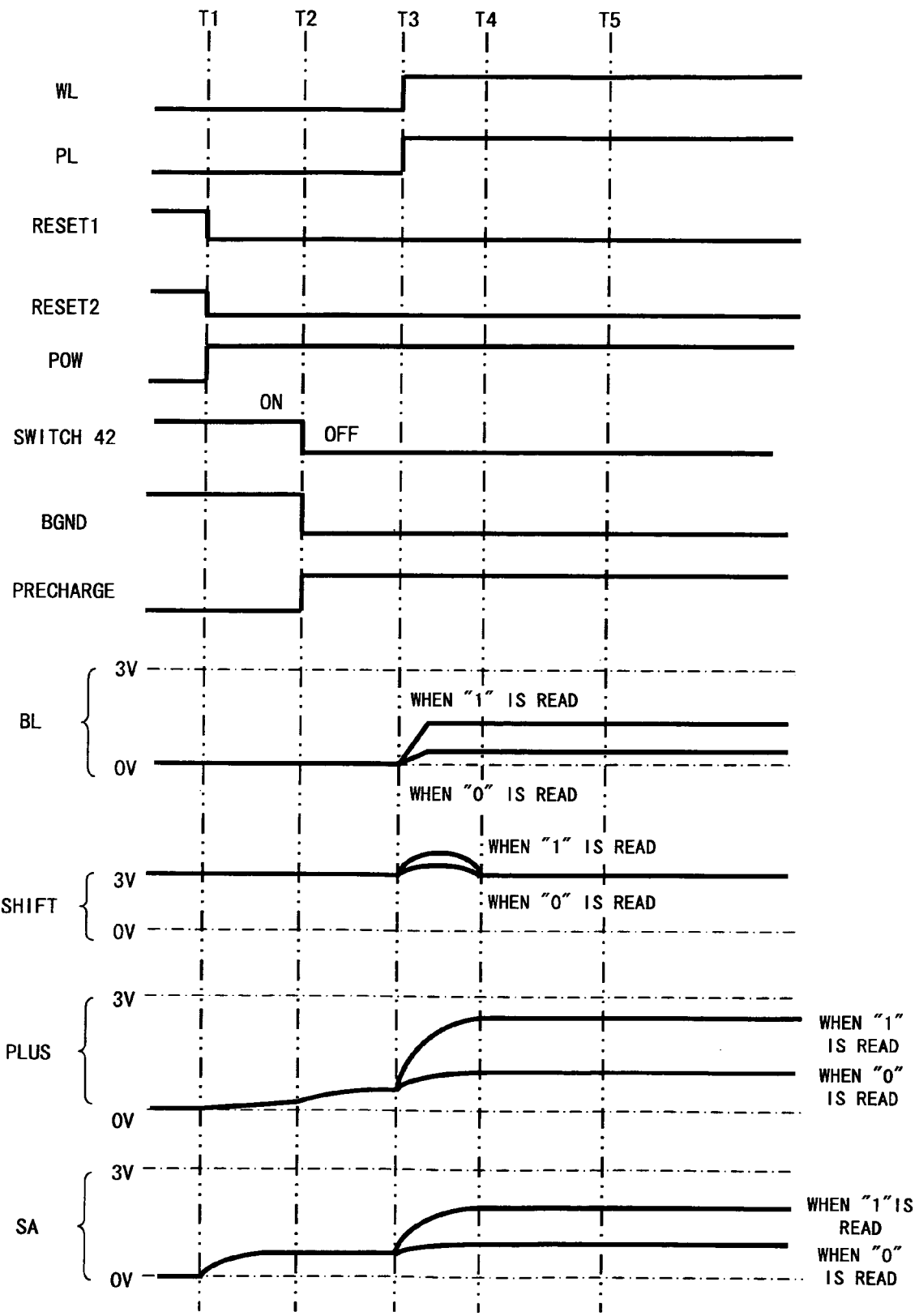
F I G. 9

US 7,729,181 B2

SEMICONDUCTOR STORAGE DEVICE USING A BITLINE GND SENSING SCHEME FOR A REDUCED REAL ESTATE OF PRE-SENSE AMPLIFIER

CROSS-REFERENCE TO RELATED APPLICATIONS

This application is based upon and claiming the benefit of priority from the prior Japanese Patent Application No. 2006-234537, filed in Aug. 30, 2006, the entire contents of which are incorporated herein by reference.

BACKGROUND OF THE INVENTION

1. Field of the Invention

The present invention relates to a data read system for a semiconductor storage device having a memory cell, and more specifically to a semiconductor storage device and data reading method capable of reducing a circuit area of a sense amplifier used in reading data, and increasing an access speed.

2. Description of the Related Art

Recently, a ferroelectric memory read system called a bit line GND sense system has been proposed. (Refer to Japanese Published Patent Application No. 2002-133857 ("Data Read Circuit, Data Reading Method, and Data Storage Device")), Japanese Published Patent Application No. 2005-293818 ("Semiconductor Memory"), and "Bitline GND Sensing Technique for Low-Voltage Operation FeRAM" (S. Kawashima, T. Endo, A. Yamamoto, K. Nakabayashi, M. Nakazawa, K. Morita, and M. Aoki, IEEE Jour. Solid-State Circuits, Vol. 37, No. 5, pp. 592-598, May 2002).) In this read system, the charge flowing from a memory cell to a bit line is transferred to a charge accumulation circuit through a charge transfer circuit called a charge transfer in a presense amplifier so that the voltage of a bit line cannot fluctuate when a voltage is applied to a plate line for a memory cell, and a logical value of the data held in the memory cell can be judged depending on the amount of charge transferred to the charge accumulation circuit.

The charge transfer is normally constituted by a pMOS transistor, and the gate-to-source voltage of the pMOS transistor is initialized to the same value as the threshold voltage before a voltage is applied to a plate line. The gate voltage of the pMOS transistor is controlled by an inverter amplifier in which output voltage drops as the voltage of a bit line rises.

FIG. 1 shows the circuit configuration of a conventional technique of a presense amplifier for reading data in a memory cell. A conventional technique of reading data from a memory cell using the bit line GND sense system is explained by referring to FIG. 1.

In FIG. 1, a presense amplifier 100 comprises: an nMOS transistor 102 for use in initializing bit line potential, in which a bit line BL (BLE or BLO) from a memory cell 101 is connected to the drain, the source is connected to the ground line, and a control signal BGND is applied to the gate; a pMOS transistor 103 for functioning as a charge transfer that transfers the charge flowing through the bit line when data is read from the memory cell 101 as described above, in which the source is connected to the bit line BL, the drain is connected to a negative voltage generation circuit described later and a level shift circuit (node MINUS), and the output node VTH of the threshold voltage generation circuit described later is connected to the gate; an inverter amplifier 104 connected between the bit line BL and the gate of the pMOS transistor 103 used as a charge transfer; a threshold voltage generation circuit 105 operating as a circuit for initializing the gate voltage of the pMOS transistor 103 as a charge transfer; a negative voltage generation circuit 106 for generating a negative voltage to allow the pMOS transistor 103 to implement the operation as a charge transfer; and a level shift circuit 107 for converting a negative voltage generated by the negative voltage generation circuit 106 into a positive voltage are provided. The output of the level shift circuit 107 is applied to the sense amplifier as described later.

The inverter amplifier 104 comprises: a CMOS inverter 110 (feedback inverter); a switch 112 for connecting an output terminal IOUT of the CMOS inverter 110 to an input terminal IIN; a capacitor 113 disposed between the input terminal IIN of the CMOS inverter 110 and the bit line BL; and a capacitor 114 disposed between the output terminal IOUT of the CMOS inverter 110 and the gate of the transistor 103 for charge transfer. The source of the pMOS transistor (not shown in the attached drawings) of the CMOS inverter 110 is connected to the power line VDD through a pMOS transistor 115 receiving a power control signal POWX at the gate. The source of the nMOS transistor (not shown in the attached drawings) of the CMOS inverter 110 is connected to the ground line through an nMOS transistor 116 receiving a power control signal POW at the gate. The power control signals POWX and POW are respectively changed to a low level and a high level when a reading operation is started, thereby activating the CMOS inverter 110. Similarly, the switch 112 is turned off when the reading operation is started. The capacitors 113 and 114 are constituted by, for example, a ferroelectric capacitor.

The threshold voltage generation circuit 105 has two transistors 117 and 118 constituting a voltage generation circuit for applying a high level (power voltage VDD) or low level (ground voltage) to a node VGENX, a capacitor 119 connected between the node VGENX and the node VTH, two transistors 121 and 122 constituting a clamping circuit connected to the node VTH, and a switch for connecting a clamping circuit to a ground line.

The voltage generation circuit has the pMOS transistor 117 and the nMOS transistor 118 connected in series between a power line VDD and a ground line. The gates of the pMOS transistor 117 and the nMOS transistor 118 respectively receive a voltage control signals VGENP and VGENN. The clamping circuit is constituted by the pMOS transistor 121, in which the source is connected to the ground line through the switch 123, and the gate and drain are connected to the node VTH, and the nMOS transistor 122, in which the gate and source are connected to the ground line, and the drain is connected to the node VTH. The capacitor 119 is constituted by, for example, a ferroelectric capacitor.

The negative voltage generation circuit 106 has a CMOS inverter 125 which receives a negative voltage control signal MGEN, and the output is connected to a node MGENX and a capacitor 126 disposed between the node MGENX and the node MINUS. The capacitor 126 is constituted by, for example, a ferroelectric capacitor.

The level shift circuit 107 has a capacitor (not shown in the attached drawings) for converting a negative voltage generated in the node MINUS into a positive voltage, an nMOS transistor, and a pMOS transistor.

FIG. 2 shows a reading operation from ferroelectric memory according to the conventional technology shown in FIG. 1. First, in the initial state, the node MINUS connected to the drain of the pMOS transistor 103 (for charge transfer) is in a floating state. Therefore, the voltage is unstable. However, since the source and the drain (p-type diffusion layer) of the pMOS transistor 103, and the back gate (n-type diffusion layer, ground voltage) form a pn junction, the voltage of the node MINUS does not rise over the voltage (about 0.8 V) in the pn junction forward direction. On the other hand, since the node VTH connected to the gate of the pMOS transistor 103 (for charge transfer) is likewise in the floating state, the potential is unstable. However, by the pMOS transistor 122 disposed in the clamping circuit, the potential of the node VTH does not rise over the threshold voltage (about 0.6 V) of the pMOS transistor.

The voltage control signals VGENP and VGENN, and the negative voltage control signal MGEN are held at a low level, and the nodes VGENX and MGENX are held at a high level. Since the control signal BGND is held at a high level, the nMOS transistor 102 (for initializing a bit line) is turned on, and the voltage of the bit line BL (BLE or BLO) is initialized to the ground voltage. The power control signals POW and POWX are respectively held in the high level and the low level, and the feedback inverter 110 (CMOS inverter) is turned off. The switches 112 and 113 are turned on.

At time T1, the power control signals POW and POWX are respectively changed into the high level and the low level, and the feedback inverter 110 is activated. Since the switch 112 is turned on, the input voltage IIN and the output voltage IOUT of the feedback inverter 110 are substantially VDD/2.

At time T2, the voltage control signals VGENP and VGENN are changed into the high level, and the node VGENX is changed from the high level to the low level. By the capacity coupling by the capacitor 119, the voltage of the node VTH drops depending on the change of the node VGENX to the low level. When the power voltage VDD is 3V and the voltage of the node VGENX drops by 3V, the voltage of the VTH is to also drop by 3V. However, by turning on the switch 123, the pMOS transistor 121 (clamping circuit) clamps the voltage of the node VTH to the threshold voltage (for example, −0.6 V) of the pMOS transistor 121. Therefore, the voltage of the node VTH once falls, and then indicates a differentiation waveform and is fixed to a negative voltage (−0.6 V). Thus, the threshold voltage generation circuit 105 operates as an initialization circuit for setting the node VTH to a predetermined voltage.

The threshold voltage of the pMOS transistor 103 is designed to be equal to the threshold voltage of the pMOS transistor 121. Therefore, when the voltage of the node VTH once falls, the pMOS transistor 103 is turned on, and the voltage of the node MINUS drops to the voltage (ground voltage) of the bit line BL.

On the other hand, since the voltage of the node MGENX is set to the high level (=power voltage VDD) by the CMOS inverter 125, the capacitor 126 is charged with the charge corresponding to the product of the capacity value and the power voltage VDD.

At time T3, the voltage control signal VGENN changes into a low level, and the nMOS transistor 118 of the voltage generation circuit is turned off. Since the pMOS transistor 117 of the voltage generation circuit has already been turned off, the node VGENX becomes the floating state. Simultaneously, the switches 112 and 123 are turned off. By turning off the switch 123, the clamp of the node VTH by the pMOS transistor 121 is released. By turning off the switch 112, the short between the input and the output of the feedback inverter 110 is released. Since the input voltage of the feedback inverter 110 is VDD/2 substantially, the feedback inverter 110 operates as an inverter amplifier having a high gain. On the other hand, the control signal BGND is also changed to a low level, and the bit line BL becomes a floating state. Thus, after time T3, when the voltage of the bit line BL rises, the capacity coupling of the capacitor 113 raises the input voltage IIN of the feedback inverter 110. The feedback inverter 110 amplifies the change of the input voltage IIN, and drops the output voltage IOUT in the opposite direction. The capacity coupling of the capacitor 114 drops the voltage of the node VTH according to the change of the output voltage IOUT.

At time T4, the negative voltage control signal MGEN changes to a high level, and the voltage of the node MGENX changes from a high level to a low level. The voltage of the node MINUS drops with the fall of the voltage of the node MGENX by the capacity coupling of the capacitor 126. When the power voltage VDD is 3V, the voltage of the node MGENX drops by 3V. Since the voltage of the node MINUS is initialized to 0V, it drops to substantially −3V by the voltage change of the node MGENX. However, the voltage of the node MINUS is higher than −3V by the loss from a parasitic capacity and the leakage current of the pMOS transistor 103 which has already been turned on.

The voltage of the node MINUS is held at the above-mentioned voltage by the capacitor 126. Thus, the negative voltage generation circuit 106 operates as an initialization circuit for setting the voltage of the node MINUS in the initial state, and setting the charge transfer capability of the pMOS transistor 103 in the initial state.

At time T5, the voltage of the word line WL and the plate line PL changes from the ground voltage to the power voltage VDD. By the rise of the word line WL, the access transistor N1 of the memory cell MC 101 is turned on, and a positive voltage is applied to the ferroelectric capacitor F1 of the memory cell MC. When the memory cell MC 101 stores the data "1", the polarity of the voltage applied to the ferroelectric capacitor F1 is the inverse of the writing operation, thereby causing a polarization inversion, and reading large inverse charge to the bit line BL. When the memory cell 101 stores data "0", the polarity of the voltage applied to the ferroelectric capacitor F1 is the same as in the writing operation, and no polarization inversion occurs and a relatively small charge is read to the bit line BL. At this time, the voltage of the bit line BL tends to rise.

However, when the voltage of the bit line BL rises a little bit, the input voltage IIN of the feedback inverter 110 rises by the capacity coupling of the capacitor 113. By the inversion and amplification effects of the feedback inverter 110 and the capacity coupling of the capacitor 114, the voltage of the node VTH drops, and the gate-to-source voltage (absolute value) of the pMOS transistor 103 becomes large. Therefore, a drain current occurs in the pMOS transistor 103, and the charge read to the bit line BL is transferred from the bit line BL to the node MINUS. As a result, the rise of the charge of the bit line BL is suppressed, and is maintained at substantially 0 V (ground voltage). Thus, the feedback inverter 110 operates as a control circuit for adjusting the charge transfer capability of the charge transfer transistor 103. Since the capacitor 126 is discharged by the charge transferred to the node MINUS, the voltage (read voltage) of the node MINUS rises. Thus, the capacitor 126 of the negative voltage generation circuit 106 operates as a read circuit for generating a read voltage depending on the accumulated charge.

In the conventional technology of the bit line GND sense system explained by referring to FIGS. 1 and 2, when the voltage of the bit line rises in the operation of reading data from a memory cell, the operation of opening a gate of the pMOS transistor for a charge transfer and transferring the charge to the sense amplifier is performed. The difference between when "1" is read as data from a memory cell, that is, the potential rise of the bit line in the term P, and when "0" is read as data, that is, the potential rise of the bit line in the term U, is amplified by a sense amplifier, and the logical value of the data is judged.

However, with a finer semiconductor integrated circuit and smaller memory cell to realize large-capacity memory, it is necessary to reduce the area of a sense amplifier. In the conventional bit line GND sense system, a circuit for generating a negative voltage is required to transfer charge to a charge accumulation circuit, and there is the problem that the circuit is a bottleneck in reducing the size of a circuit. Furthermore, the time to initialize the negative voltage generation circuit is also required, and it is a bottleneck in realizing high-speed access.

SUMMARY OF THE INVENTION

The present invention aims at reducing the area of the circuit of an amplifier for reading data written to a memory cell, more specifically to a presense amplifier, and realizing high-speed read access to a memory cell.

The present invention provides a semiconductor storage device comprising a memory cell connected to a plate line and a bit line, a potential shift circuit which is connected to a bit line, temporarily changes in output voltage corresponding to the voltage change of the bit line when a voltage is applied to the plate line, and then outputs a voltage before the application of the voltage to the plate line, a charge transfer circuit for transferring charge stored on potential shift circuit corresponding to the temporary output voltage change of the potential shift circuit, and a charge accumulation circuit for generating a read voltage from a memory cell after accumulating the transferred charge.

BRIEF DESCRIPTION OF THE DRAWINGS

FIG. 3 is a block diagram of the configuration showing the principle of the presense amplifier in the semiconductor storage device according to the present invention;

FIG. 6 shows the circuit showing the configuration according to the first embodiment of the presense amplifier;

FIG. 7 is a time chart of an operation example of the presense amplifier shown in FIG. 6;

FIG. 8 shows the configuration of the circuit according to the second embodiment of the presense amplifier; and FIG. 9 is a time chart of an operation example of the presense amplifier shown in FIG. 8.

DESCRIPTION OF THE PREFERRED EMBODIMENTS

Figure 1:
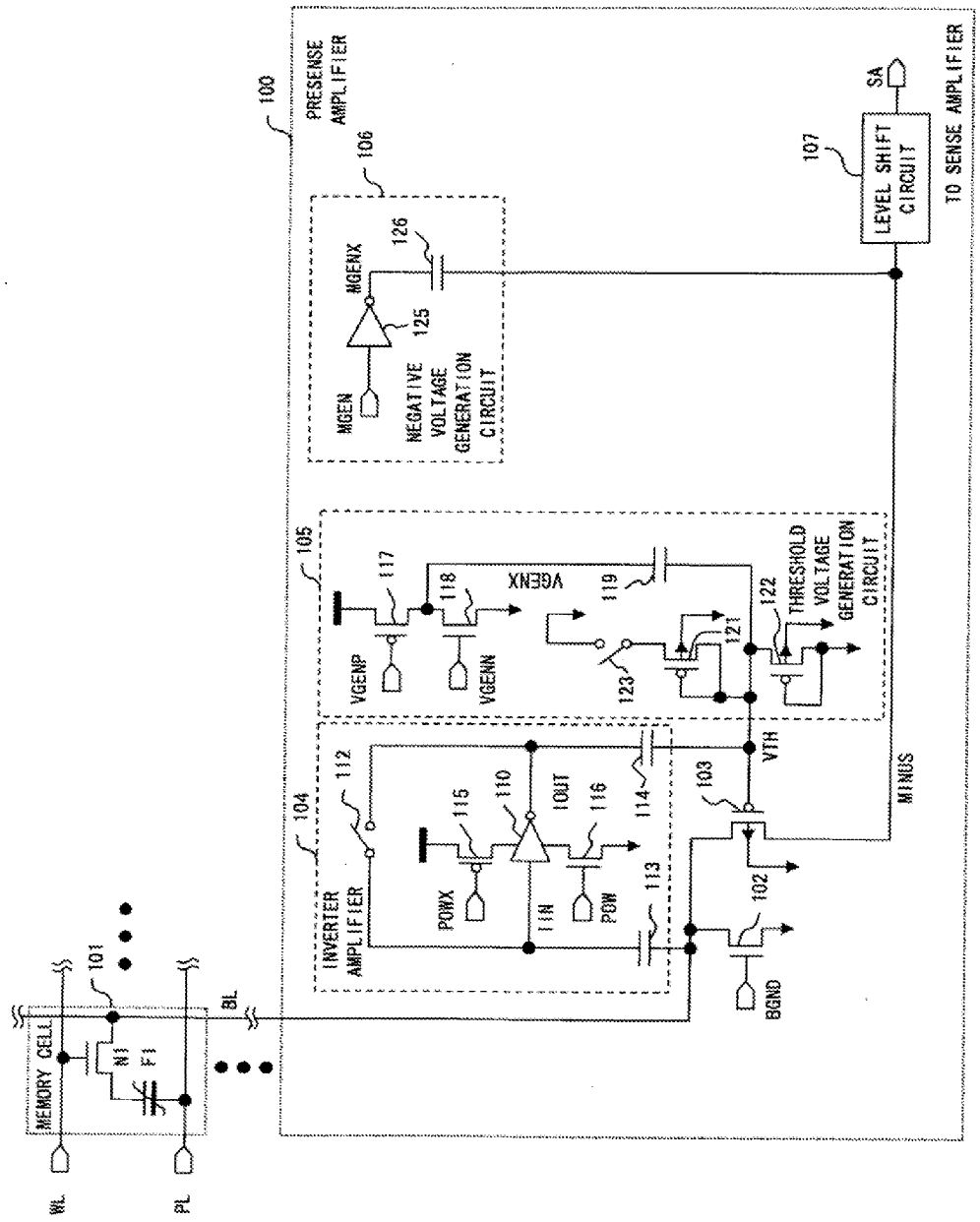
FIG. 1 shows the configuration of a circuit according to the conventional technology of a bit line GND sense system.
Figure 2:
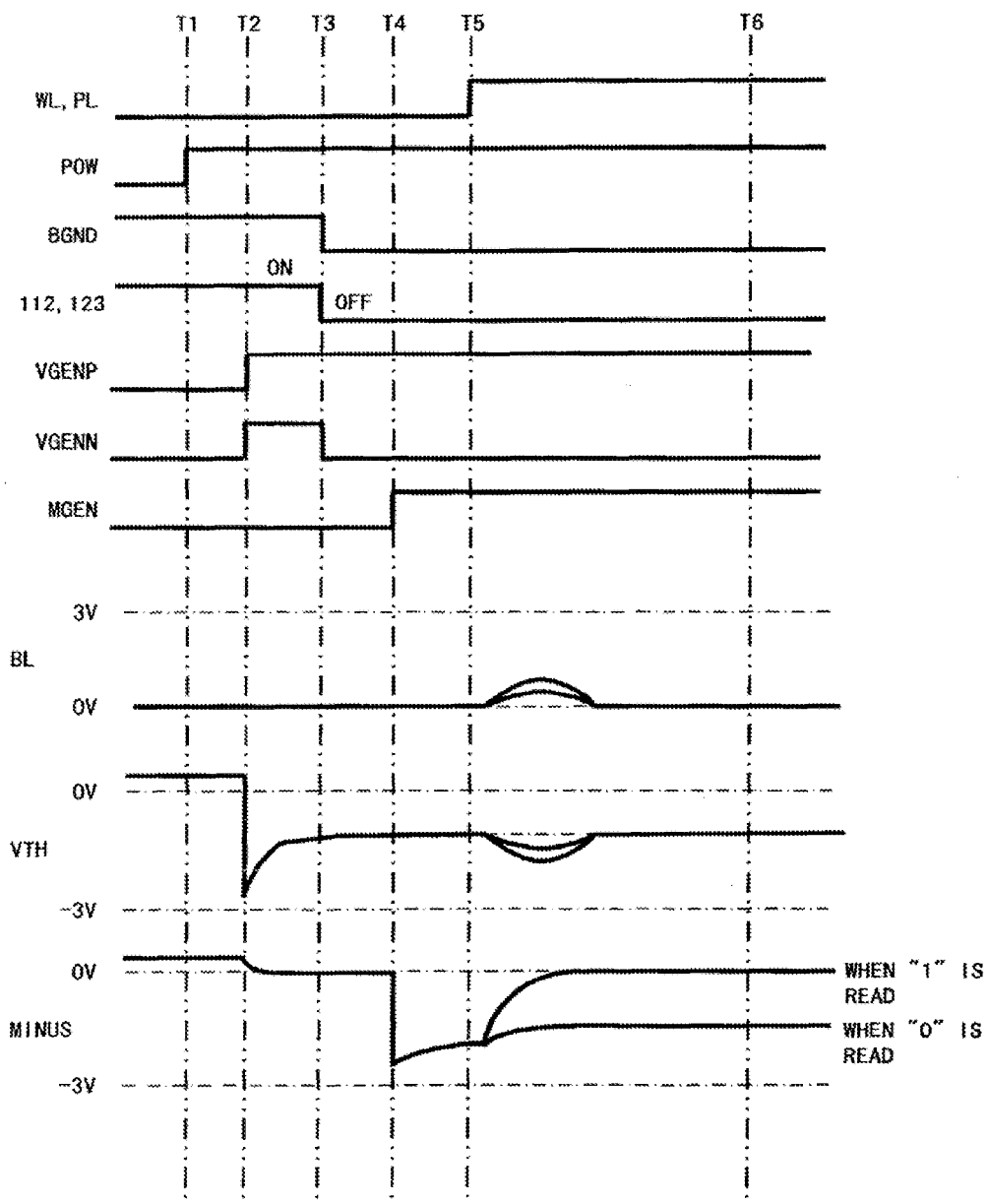
FIG. 2 is a time chart of the operation according to the conventional technology of the presense amplifier shown in FIG. 1.

FIG. 3 is a block diagram of the basic configuration of the presense amplifier used in reading data from a memory cell in the semiconductor storage device according to the present invention. In FIG. 3, a presense amplifier 2 is provided between a memory cell 1 and a sense amplifier 3.

The semiconductor storage device according to the present invention comprises at least the memory cell 1, and a potential shift circuit 4 in the presense amplifier 2. The memory cell 1 is connected to a plate line and a bit line. The potential shift circuit 4 is connected to the memory cell 1 by the bit line, the output voltage is temporarily changed depending on the voltage change of the bit line when a voltage is applied to the plate line, and then the voltage before the application of the voltage to the plate line is output.

In a mode for embodying the present invention, the presense amplifier 2 can also comprise a charge transfer circuit 5, a charge accumulation circuit 6, and a bit line initialization circuit 7. The charge transfer circuit 5 is connected to the potential shift circuit 4, the charge accumulation circuit 6 is connected to the charge transfer circuit 5, the bit line initialization circuit 7 is connected to the bit line, and the output of the charge accumulation circuit 6 is applied to the sense amplifier 3.

The charge transfer circuit 5 transfers charge stored on potential shift circuit depending on a temporary change of an output voltage of the potential shift circuit 4 corresponding to the voltage change of the bit line. The charge accumulation circuit 6 generates a read voltage from the memory cell 1 by accumulating the transferred charge. The bit line initialization circuit 7 initializes the potential of the bit line prior to the data read from the memory cell 1 connected to the bit line.

Thus, according to the present invention, the potential shift circuit 4 for amplifying the voltage change of output from the potential shift circuit 4 when a voltage is applied to the plate line is provided in the presense amplifier 2.

According to the present invention, the negative voltage generation circuit in the presense amplifier used in the bit line GND sense system of the conventional technology shown in FIG. 1 is not required, and it is not necessary to initialize the negative voltage generation circuit, thereby reducing the area of the circuit for reading data written to the memory cell, and the memory read access can be performed at a high speed.

Figure 4:
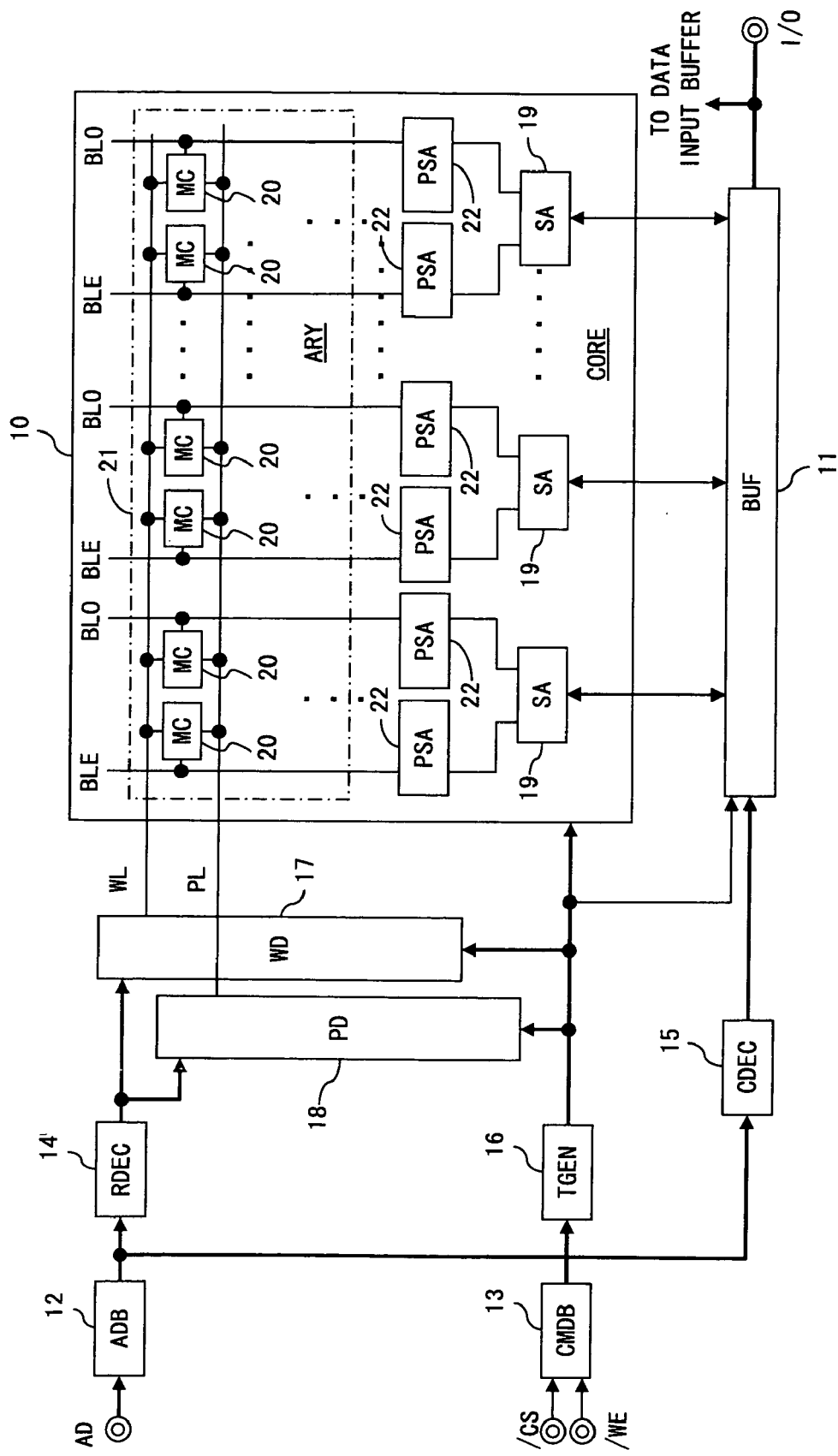
FIG. 4 is a block diagram of the basic configuration of the semiconductor storage device according to the present invention.

FIG. 4 is a block diagram of the configuration of the semiconductor storage device to which the present invention is applied. In FIG. 4, the semiconductor storage device comprises a memory core 10, an address buffer (ADB) 12, a command buffer (CMDB) 13, a row decoder (RDEC) 14, a column decoder (CDEC) 15, a timing generation circuit (TGEN) 16, a word driver (WD) 17, a plate driver (PD) 18, and a data output buffer (BUF) 11. The configuration required in reading data from a memory cell, and an input buffer required in writing data, etc. is omitted.

The address buffer ADB 12 receives an address signal AD through an address terminal, and outputs the received signal to the row decoder RDEC 14 and the column decoder CDEC 15. The row decoder RDEC 14 decodes the high bits (row address) of the address signal and generates a row decode signal, and output the generated signal to the word driver WD 17 and the plate driver PD 18.

The column decoder CDEC 15 decodes the low bit (column address) of the address signal and generates a column decode signal, and outputs the generated signal to the column decoder string incorporated into the data output buffer BUF 11.

The command buffer CMDB 13 receives command signals such as a chip select signal/CS, a write enable signal/WE, etc. through a command terminal, and outputs the received signal to the timing generation circuit TGEN 16. The timing generation circuit TGEN 16 decodes the operation mode indicated by the received command signal, and outputs a timing signal for operation of the plate driver PD 18, the word driver WD 17, the data output buffer BUF 11, the presense amplifier PSA 22 as will hereinafter be described, etc. depending on the decoding result.

The plate driver PD 18 selects a predetermined plate line PL in response to the timing signal from the timing generation circuit TGEN 16 and the row decode signal from the row decoder RDEC 14. The potential of the selected plate line PL changes from the low level to the high level for a predetermined period.

The word driver WD 17 selects a predetermined word line WL in response to the timing signal from the timing generation circuit TGEN 16 and the row decode signal from the row decoder RDEC 14. The potential of the selected word line WL changes from the low level to the high level for a predetermined period.

The memory core 10 has an array ARY 21 of a memory cell MC 20, a presense amplifier PSA 22 (bit line GND sense circuit) corresponding to the bit line BL (BLE and BLO), and a sense amplifier SA 19 for receiving the output of a pair of presense amplifiers PSA 22 corresponding to the bit lines BLE and BLO.

The presense amplifier PSA 22 operates when data is read from the memory cell MC 20. The presense amplifier PSA 22 converts the charge read to the bit line BLE (or BLO) into a voltage, and outputs converted voltage to the sense amplifier SA 19. The presense amplifier PSA 22 is described later in detail. The sense amplifier SA 19 amplifies the differentiation of the read voltages output from the pair of presense amplifiers PSA 22 corresponding to the bit lines BLE and BLO, and outputs the amplified data signals to the data output buffer BUF 11. The data output buffer BUF 11 selects, for example, 16 bits of read data according to a column decode signal from plural bits of data read from the memory core 10, and outputs the selected read data to a data input/output terminal I/O. The data input/output terminal I/O is constituted by, for example, 16 bits.

Figure 5:
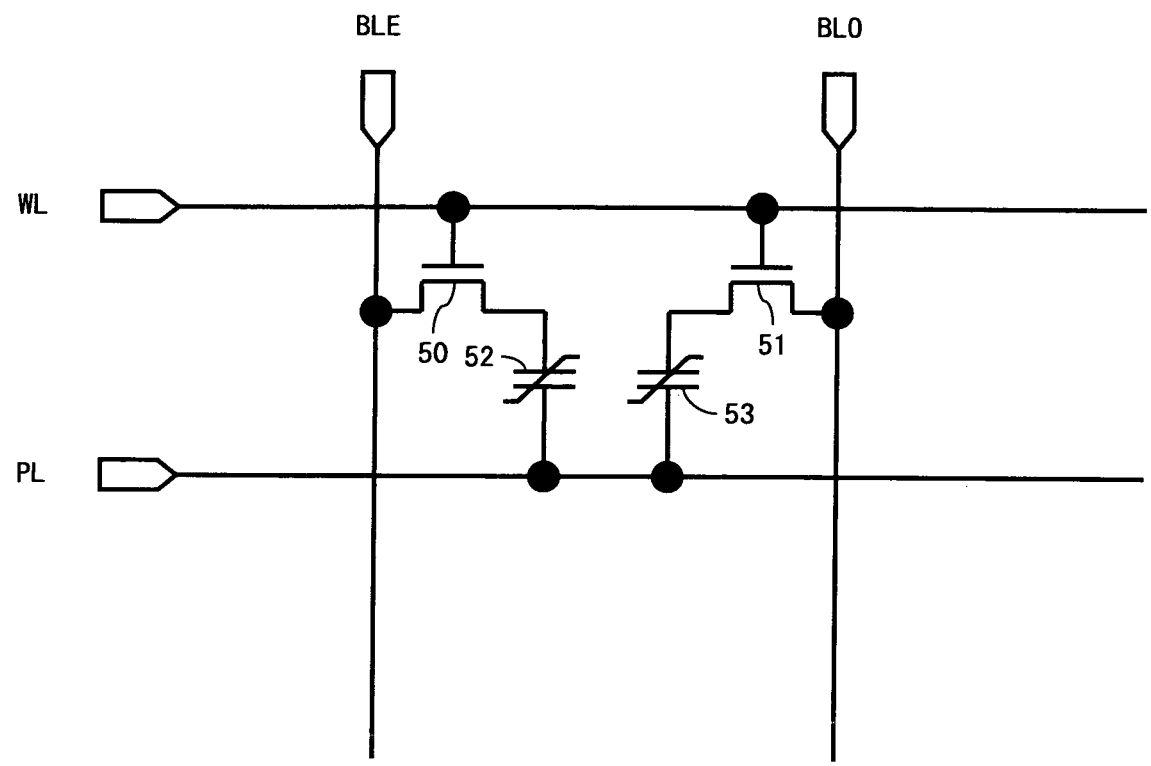
FIG. 5 shows the circuit showing the configuration of a memory cell.

FIG. 5 shows the detailed configuration of a circuit of a memory cell. In FIG. 5, the memory cell is connected to the bit lines BLE and BLO, the word line WL, and the plate line PL. Inside the memory cell, two nMOS transistors 50 and 51 are respectively connected to the bit line BLE or BLO and capacitors 52 and 53, and their gates are connected to the word line WL. One end of each of the capacitors 52 and 53 is connected to the plate line PL. By using a ferroelectric capacitor as the capacitors 52 and 53, the area can be reduced, but it is not necessary that the capacitors are to be ferroelectric capacitors.

FIG. 6 shows the detailed configuration of the circuit according to the first embodiment of the presense amplifier according to the present invention. In FIG. 6, the presense amplifier PSA 22 is connected by the memory cell MC 20 and the bit line BL (BLE or BLO). It comprises an nMOS transistor 23 for initializing the potential of a bit line, a potential shift circuit 24, a pMOS transistor 25 for charge transfer, a threshold voltage generation circuit 26, a charge accumulation circuit 27, and a source follower circuit 28. The output of the source follower circuit 28 is connected to the sense amplifier SA 19.

The gate of the nMOS transistor 23 for initializing the potential of a bit line receives a control signal BGND, the source is connected to the ground line, and the drain is connected to a bit line. The charge transfer circuit according to claim 2 of the present invention corresponds to the pMOS transistor 25, and the bit line initialization circuit according to claim 5 corresponds to the nMOS transistor 23.

The potential shift circuit 24 comprises a pMOS transistor 31, in which the gate receives a control signal PRECHARGE, the source is connected to the power line VDD, and the drain is connected to the output node SHIFT of the potential shift circuit 24, and a capacitor 30 disposed between the node SHIFT and the bit line BLE (or BLO). The capacitor 30 is constituted by, for example, a ferroelectric capacitor.

In the transistor 25 for charge transfer, the gate (control terminal) is connected to the output node VTH of the threshold voltage generation circuit 26, the source is connected to the output node SHIFT of the potential shift circuit 24, and the drain is connected to the input/output node PLUS of the charge accumulation circuit 27.

The threshold voltage generation circuit 26 has a pMOS transistor 32 in series connected between the power line VDD and the ground line and an nMOS transistor 33. The gate and the source of the pMOS transistor 32 are connected to the power line VDD, and the drain is connected to the output node VTH. On the other hand, the gate and the drain of the nMOS transistor 33 are connected to the output node VTH, and the source is connected to the ground line.

The charge accumulation circuit 27 comprises an nMOS transistor 35, in which the drain is connected to the input/output node PLUS, the gate receives a control signal RESET 1, and the source is connected to the ground line, and a capacitor 34 disposed between the node PLUS and the ground line. The capacitor 34 is constituted by, for example, a ferroelectric capacitor.

The source follower circuit 28 has nMOS transistors 36 and 37 in series connected between the power line VDD and the ground line. The gate of the nMOS transistor 37 receives a control signal RESET 2, the source is connected to the ground line, and the drain is connected to the output node SA. On the other hand, the gate of the nMOS transistor 36 is connected to the input/output node PLUS of the charge accumulation circuit 27, the drain is connected to the power line VDD, and the source is connected to the output node SA. The source follower circuit is used to monitor the potential of the PLUS node using the function of converting the impedance.

FIG. 7 shows the reading operation from the ferroelectric memory according to the first embodiment of the presense amplifier shown in FIG. 6. First, in the initial state, the potential of the node PLUS connected to the drain of the pMOS transistor 25 (for charge transfer) is fixed to L by the control signal RESET 1 (H) input to the gate of the nMOS transistor 35. The potential of the node SHIFT connected to the source of the pMOS transistor 25 is fixed to H by the control signal PRECHARGE (L) input to the gate of the pMOS transistor 31. Furthermore, the potential of the gate of the pMOS transistor 25 is clamped to the power voltage VDD-VTHP (p-channel threshold) by the pMOS transistor 32 and the nMOS transistor 33. On the other hand, the potential of the bit line BLE (or BLO) is fixed to L by the control signal BGND (H) input to the gate of the nMOS transistor 23. The potential of the output SA of the source follower circuit 28 is fixed to L by the control signal RESET 2 (H) input to the gate of the nMOS transistor 37. The control signals BGND, PRECHARGE, RESET 1, and RESET 2 are generated by the timing generation circuit TGEN 16 shown in FIG. 4.

At time T1, the RESET 1 and RESET 2 are changed to the low level, and the charge accumulation circuit 27 and the source follower circuit 28 are in the standby state for reading data from the memory. At this time, the potential of the node PLUS rises a little bit after time T1 by the leakage of the pMOS transistor 25. Since both of the gates of the nMOS transistors 36 and 37 are at the low level and both of the transistors are turned off, the potential of the output node SA of the source follower circuit 28 is the intermediate potential between the power voltage VDD and the ground voltage depending on the ratio of the dimensions of the transistors 36 and 37.

At time T2, the control signal BGND changes from the high level to the low level, the control signal PRECHARGE changes from the low level to the high level, and the bit line BLE, and the potential of the output node SHIFT of the potential shift circuit 24 where the potential shift circuit 24 enters the standby state become the floating state. At this time, the potential of the node PLUS connected to the drain of the pMOS transistor 25 rises a little bit after time T2 by the leakage of the pMOS transistor 25.

At time T3, the voltages of the word line WL and the plate line PL change from the ground voltage to the power voltage VDD. By the rise of the word line WL, the access transistor 50 of the memory cell MC 20 is turned on, and a positive voltage is applied to the ferroelectric capacitor 52. When the memory cell MC 20 stores the data "1", the polarity of the voltage applied to the ferroelectric capacitor 52 is the inverse of the writing operation. Therefore, polarization inversion occurs, and a large inverse charge is read to the bit line. When the memory cell MC 20 stores the data "0", the polarity of the voltage applied to the ferroelectric capacitor 52 is the same as in the reading operation. Therefore, no polarization inversion occurs, and relatively low charge is read to the bit line. At this time, the voltage tends to rise.

When the voltage of the bit line rises a little bit, the capacity coupling of the capacitor 30 raises the potential of the output node SHIFT of the potential shift circuit 24. At this time, since the gate-to-source voltage (absolute value) of the pMOS transistor 25 rises, a drain current is generated in the pMOS transistor 25, and the charge accumulated in the capacitor 30 of the potential shift circuit 24 is transferred from the node SHIFT to the node PLUS. Therefore, the rise of the potential of the node SHIFT is suppressed, and is maintained again at time T4 to the power voltage VDD. Since the capacitor 34 accumulates the charge transferred to the node PLUS, the voltage (read voltage) of the node PLUS rises. Thus, the capacitor 34 of the charge accumulation circuit 27 operates as a read circuit for generating a read voltage depending on the accumulated charge.

After time T4, for example, considering a margin, the read voltage of the node PLUS corresponding to the memory cell MC 20 connected to the bit line BL (BLE or BLO) is output to the node SA by the source follower circuit 28, and the differentiation-amplified by the sense amplifier SA 19 shown in FIG. 4. Then, the logical value of the data stored in the memory cell MC 20 is read. Then, as in the common ferroelectric memory, the operation for restoring the polarization state of the memory cell MC 20 that has been polarization inverted in the reading operation is performed.

FIG. 8 shows in detail the circuit according to the second embodiment of the presense amplifier PSA 22 shown in FIG. 4. The presense amplifier PSA 22 has the transistor 23 for initializing a bit line, the potential shift circuit 24, the pMOS transistor 25 for charge transfer, the threshold voltage generation circuit 26, the charge accumulation circuit 27, the source follower circuit 28, and an inverter amplifier 40.

In the second embodiment, since only the inverter amplifier 40 corresponding to the inverse amplification circuit according to claim 6 is added to the first embodiment shown in FIG. 6, the configuration of the inverter amplifier 40 is explained below. The inverter amplifier 40 comprises a CMOS inverter 41 (feedback inverter), a switch 42 for connecting the output terminal IOUT of the CMOS inverter 41 to the input terminal IIN, a capacitor 43 disposed between the input terminal IIN of the CMOS inverter 41 and the bit line BLE, and a capacitor 44 disposed between the output terminal IOUT of the CMOS inverter 41 and the gate of the transistor 25 for charge transfer. The source of the pMOS transistor (not shown in the attached drawings) of the CMOS inverter 41 is connected to the power line VDD through a pMOS transistor 46 which receives a power control signal POWX at the gate. The source of the nMOS transistor (not shown in the attached drawings) of the CMOS inverter 41 is connected to the ground line through an nMOS transistor 47 which receives a power control signal POW at the gate. The power control signals POWX and POW changes respectively to the low level and the high level when the reading operation is started, and the CMOS inverter 41 is activated. Similarly, the switch 42 is turned off when the reading operation is started. The capacitors 43 and 44 are constituted by, for example, a ferroelectric capacitor. The control signals for turning on/off the switch 42, that is, the power control signals POW and POWX, are generated by the timing generation circuit TGEN 16 shown in FIG. 4.

FIG. 9 shows the operation of reading ferroelectric memory according to the second embodiment of a presense amplifier. First, in the initial state, the potential of the node PLUS connected to the drain of the pMOS transistor 25 (for charge transfer) is fixed to L by the control signal RESET 1 (H) input to the gate of the nMOS transistor 35. Furthermore, the potential of the node SHIFT connected to the source of the pMOS transistor 25 is fixed to H by the control signal PRECHARGE (L) input to the gate of the pMOS transistor 31. Furthermore, the gate of the pMOS transistor 25 is clamped to the power voltage VDD-VTHP (p-charge threshold) by the pMOS transistor 32 and the nMOS transistor 33. On the other hand, the potential of the bit line BLE (or BLO) is fixed to L by the control signal BGND (H) input to the gate of the nMOS transistor 23. The potential of the output SA of the source follower circuit 28 is fixed to L by the control signal RESET 2 (H) input to the gate of the nMOS transistor 37.

At time T1, RESET 1 and RESET 2 change to the low level, and the charge accumulation circuit 27 and the source follower circuit 28 enter the standby state. At this time, the potential of the node PLUS slightly rises after time T1 by the leakage of the pMOS transistor 25. Since the gates of both nMOS transistors 36 and 37 are at the low level, both transistors are turned off, and the potential of the output node SA of the source follower circuit 28 becomes the intermediate potential between the power voltage VDD and the ground voltage depending on the dimension ratio between the transistors 36 and 37. On the other hand, the power control signals POW and POWX respectively change to the high level and the low level, so feedback inverter 41 is activated. Since the switch 42 is turned on, the input voltage IIN and the output voltage IOUT of the feedback inverter 41 are substantially VDD/2.

At time T2, the control signal BGND changes from the high level to the low level, the control signal PRECHARGE changes from the low level to the high level, and the bit line BLE, and the potential of the output node SHIFT of the potential shift circuit 24 where the potential shift circuit 24 enters the standby state become the floating state. At this time, the potential of the node PLUS connected to the drain of the pMOS transistor 25 rises a little bit after time T2 by the leakage of the pMOS transistor 25. Simultaneously, the switch 42 is turned off. By the turnoff of the switch 42, the short between the input and the output of the feedback inverter 41 can be released. Since the input voltage of the feedback inverter 41 is substantially VDD/2, the feedback inverter 41 operates as an inverter amplifier having a high gain. Thus, after time T3, when the voltage of a bit line rises, the input voltage IIN of the feedback inverter 41 rises by the capacity coupling of the capacitor 43. The feedback inverter 41 amplifies the change of the input voltage IIN, and drops the output voltage IOUT to the opposite direction. By the capacity coupling of the capacitor 44, the voltage of the node VTH drops with the change of the output voltage IOUT.

At time T3, the voltages of the word line WL and the plate line PL change from the ground voltage to the power voltage VDD. By the rise of the word line WL, the access transistor 50 of the memory cell MC 20 is turned on, and a positive voltage is applied to the ferroelectric capacitor 52. When the memory cell MC 20 stores the data "1", the polarity of the voltage applied to the ferroelectric capacitor 52 is the inverse of the writing operation. Therefore, polarization inversion occurs, and a large inverse charge is read to the bit line. When the memory cell MC 20 stores the data "0", the polarity of the voltage applied to the ferroelectric capacitor 52 is the same as in the reading operation. Therefore, no polarization inversion occurs, and relatively low charge is read to the bit line. At this time, the voltage tends to rise.

When the voltage of the bit line rises a little bit, the capacity coupling of the capacitor 30 raises the potential of the output node SHIFT of the potential shift circuit 24. At this time, since the gate-to-source voltage (absolute value) of the pMOS transistor 25 rises, a drain current is generated in the pMOS transistor 25, and the charge accumulated in the capacitor 30 of the potential shift circuit 24 is transferred from the node SHIFT to the node PLUS. On the other hand, when the voltage of a bit line rises a little bit, the capacity coupling with the capacitor 43 raises the input voltage IIN of the feedback inverter 41. By the inverse amplification effect of the feedback inverter 41 and the capacity coupling of the capacitor 44, the voltage of the node VTH drops, and the gate-to-source voltage (absolute value) of the pMOS transistor 25 further increases. Therefore, the feedback inverter 41 operates as a control circuit for adjusting the charge transfer capability of the charge transfer transistor 25.

The charge transfer capability is controlled by changing the capacity of, for example, two capacitors 43 and 44, but when the capacity of the capacitor 44 increases, the load of the inverter amplifier 40 further increases. Therefore, it is necessary to increase, for example, the gate width of the transistor constituting an inverter amplifier.

After all, the rise of the potential of the node SHIFT is suppressed, and is maintained again at time T4 to the power voltage VDD. Since the capacitor 34 accumulates the charge transferred to the node PLUS, the voltage (read voltage) of the node PLUS rises. Thus, the capacitor 34 of the charge accumulation circuit 27 operates as a read circuit for generating a read voltage depending on the accumulated charge.

At time T5, the read voltage of the node PLUS corresponding to the memory cell MC 20 connected to the bit line BL (BLE or BLO) is output to the node SA by the source follower circuit 28, and is differentiation-amplified by the sense amplifier SA 19 shown in FIG. 4. Then, the logical value of the data stored in the memory cell MC 20 is read. Then, in the common ferroelectric memory as well, the operation for restoring the polarization state of the memory cell MC 20 that has been polarization inverted in the reading operation is performed.

In the bit line GND sense system, when a reading operation is performed, as voltage of the bit line slightly rises, a potential difference is generated between the gate and the source of the pMOS transistor 25 for charge transfer. Thus, the gate of the pMOS transistor 25 is opened to generate a drain current, the charge is transferred to the charge accumulation circuit 27, and the potential of the bit line is returned to the GND again. To realize the above-mentioned operation, it was necessary to provide the threshold voltage generation circuit 105 (initialization circuit), the negative voltage generation circuit 106 (charge accumulation circuit, initialization circuit), and the level shift circuit 107 in the conventional technology shown in FIG. 1. However, according to the present invention, these circuits are not required, or their configurations are simpler.

The areas of the potential shift circuit 24, the source follower circuit 28, and the threshold voltage generation circuit 26 after a configuration change are small, and thus the area of the sense amplifier can be reduced. Furthermore, the number of initialization circuits and the control signals is small, thereby successfully shortening the access time.

What is claimed is:

1. A semiconductor storage device, comprising:
a memory cell connected to a plate line and a bit line; and
a potential shift circuit, which is connected to the bit line, to change an output voltage temporarily depending on a voltage change of the bit line when an input voltage is applied to the plate line.

2. The device according to claim 1, further comprising:
a charge transfer circuit, which is connected to the potential shift circuit, to transfer charge stored on the potential shift circuit in response to the temporary change of the output voltage depending on the voltage change of the bit line.

3. The device according to claim 2, further comprising:
a charge accumulation circuit, which is connected to the charge transfer circuit, to accumulate charge transferred from the charge transfer circuit, and generate a read voltage from the memory cell.

4. The device according to claim 3, further comprising:
a sense amplifier to determine a logical value of data held in the memory cell depending on input of the read voltage.

5. The device according to claim 2, further comprising:
a bit line initialization circuit, which is connected to the bit line, to initialize potential of the bit line before reading data from the memory cell connected to the bit line.

6. The device according to claim 5, further comprising:
an inverse amplification circuit, which is connected to the bit line, to control a transfer capability of the charge transfer circuit depending on the voltage change of the bit line.

7. The device according to claim 6, further comprising:
a charge accumulation circuit, which is connected to the charge transfer circuit, to accumulate charge transferred from the charge transfer circuit, and generate a read voltage from the memory cell.

8. The device according to claim 7, further comprising:
a sense amplifier to determine a logical value of data held in the memory cell depending on input of the read voltage generated by the charge accumulation circuit.

9. The device according to claim 1, further comprising:
a bit line initialization circuit, which is connected to the bit line, to initialize potential of the bit line before reading data from the memory cell connected to the bit line.

10. A method for reading data from a memory cell connected to a plate line and a bit line, comprising:
changing an output voltage temporarily with a potential shift circuit connected to the bit line, the changing depending on a voltage change of the bit line when an input voltage is applied to the plate line;
transferring charge stored on the potential shift circuit with a charge transfer circuit connected to the potential shift circuit;
accumulating the transferred charge with a charge accumulation circuit; and
generating a read voltage from the memory cell.

* * * * *